US012577638B2

(12) United States Patent
Aguilar Santillan et al.

(10) Patent No.: US 12,577,638 B2
(45) Date of Patent: Mar. 17, 2026

(54) CASTABLE ALUMINUM ALLOYS FOR WAFER HANDLING CHAMBERS IN SEMICONDUCTOR PROCESSING SYSTEMS

(71) Applicant: ASM IP Holding B.V., Almere (NL)

(72) Inventors: Joaquin Aguilar Santillan, Gilbert, AZ (US); Hong Gao, San Jose, CA (US); Shanker Kuttath, Austin, TX (US); Shaofeng Chen, Austin, TX (US); Gary Urban Keppers, Morgan Hill, CA (US); Felix Rabinovich, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 479 days.

(21) Appl. No.: 18/100,048

(22) Filed: Jan. 23, 2023

(65) Prior Publication Data

US 2023/0235428 A1     Jul. 27, 2023

Related U.S. Application Data

(60) Provisional application No. 63/434,995, filed on Dec. 23, 2022, provisional application No. 63/302,800, filed on Jan. 25, 2022.

(51) Int. Cl.
*C22C 1/02*          (2006.01)
*B22D 21/00*         (2006.01)
(Continued)

(52) U.S. Cl.
CPC ............ *C22C 1/026* (2013.01); *B22D 21/007* (2013.01); *C22C 21/08* (2013.01); (Continued)

(58) Field of Classification Search
CPC . C22F 1/04; C22C 1/026; C22C 21/08; C22C 21/00; C22C 21/06; B22D 21/007; (Continued)

(56) References Cited

U.S. PATENT DOCUMENTS 6,921,512 B2    7/2005    Doty
9,771,635 B2    9/2017    Wang
(Continued)

FOREIGN PATENT DOCUMENTS

JP          2007308766       * 11/2007
WO     WO 2005045081      * 5/2005

OTHER PUBLICATIONS

Machine Translation JP 2007-308766 (Year: 2007).*
(Continued)

*Primary Examiner* — Rodney G Mcdonald
(74) *Attorney, Agent, or Firm* — Snell & Wilmer L.L.P.

(57) ABSTRACT

A substrate handling chamber body is formed from a castable aluminum alloy including a manganese (Mn) constituent and an iron (Fe) constituent. The castable aluminum alloy has a manganese (Mn) constituent-to-iron (Fe) constituent ratio that between about 1.125 and about 1.525 to limit microporosity and shrinkage porosity within the castable aluminum alloy forming the substrate handling chamber body. Semiconductor processing systems and methods of making substrate handling chamber bodies for semiconductor processing systems are also described.

19 Claims, 6 Drawing Sheets

(51) Int. Cl.
C22C 21/08 (2006.01)
H01L 21/67 (2006.01)
H01L 21/687 (2006.01)

(52) U.S. Cl.
CPC .... H01L 21/67167 (2013.01); H01L 21/6719 (2013.01); H01L 21/67196 (2013.01); H01L 21/67201 (2013.01); H01L 21/68707 (2013.01)

(58) Field of Classification Search
CPC .............. B22D 21/04; H01L 21/67167; H01L 21/6719; H01L 21/67196; H01L 21/67201; H01L 21/68707
USPC ...................................... 118/719; 204/298.25
See application file for complete search history.

(56) References Cited

U.S. PATENT DOCUMENTS

| | | | |
|---|---|---|---|
| 11,280,292 B2 | 3/2022 | Morgenstern | |
| 2005/0199318 A1 | 9/2005 | Doty | |
| 2006/0024517 A1* | 2/2006 | Doan ..................... | C23C 16/20 |
| | | | 428/701 |
| 2016/0168665 A1* | 6/2016 | Rafetzeder ............. | B22D 25/02 |
| | | | 420/531 |

OTHER PUBLICATIONS

Machine Translation 2005/045081 (Year: 2005).*
Atlas Steel 5083 Data Sheet (Year: 2021).*
Carmen Stanica et al., "Influence of Iron and Manganese on Structure and Microporosity of the DC Cast AA5083 Alloy," The Light Metals Ed. GB, 2009; p. 823-826.
Radetic, Tamara et al., "Microstructure Evolution of a Modified AA5083 Aluminum Alloy During a Multistage Homogenization Treatment," Materials Characterization, vol. 65, 2012; p. 16-27.
Hatch, John E., "Aluminum: Properties and Physical Metallurgy" 2nd ed. Metals Park Ohio: ASM; 1984.
Romhanji, E et al., Precipitation Processes in Al—Mg—(Mn, Cu) Type Alloy Sheets Evaluated Through Electrical Resistivity Variations; J Nondestruct Eval; 2010;29:43-8.
Popovic, Miljana et al., "Characterization of microstructural changes in an Al-6.8wt.% Mg alloy sheets by electrical resistivity measurements," Materials Science and Engineering A 492 (2008) 460-467.
Porter, D.A. et al., Phase Transformations in Metals and Alloys. 2ed. Van Nostrand Reinhold (UK) Co Ltd.; 1981.
Dore, X et al., Modeling of Microsegregation in Ternary Alloys: Application to the Solidification of Al—Mg—Si; Acta Mater 2000;48:3951-62.

* cited by examiner

CASTABLE ALUMINUM ALLOYS FOR WAFER HANDLING CHAMBERS IN SEMICONDUCTOR PROCESSING SYSTEMS

CROSS-REFERENCE TO RELATED APPLICATIONS

This application claims priority to U.S. Provisional Patent Application Ser. No. 63/302,800, filed Jan. 25, 2022, and titled CASTABLE ALUMINUM ALLOYS FOR WAFER HANDLING CHAMBERS IN SEMICONDUCTOR PROCESSING SYSTEMS; and U.S. Provisional Patent Application Ser. No. 63/434,995, filed Dec. 23, 2022, and titled CASTABLE ALUMINUM ALLOYS FOR SUBSTRATE HANDLING CHAMBER BODIES IN SEMICONDUCTOR PROCESSING SYSTEMS, the disclosures of which are hereby incorporated by reference in their entirety.

FIELD OF INVENTION

The present disclosure generally relates to castable aluminum alloys, and more particularly, to castable aluminum alloys having a relatively high ratio of manganese (Mn) to iron (Fe) to limit porosity and improve mechanical properties of articles formed from such alloys.

BACKGROUND OF THE DISCLOSURE

Aluminum alloys, such as 508 aluminum alloys, are commonly employed to form structures in semiconductor processing systems. Such aluminum alloys generally include some about of iron (Fe) on a weight percentage basis, which enters into the aluminum alloy composition when the aluminum alloy is prepared from bauxite-containing ferric oxide. Such aluminum alloys typically include manganese (Mn) on a weight percentage basis as a desired alloying element because of the strong beneficial effect that manganese (Mn) has on the morphology of iron-bearing intermetallic phases that present within the microstructure aluminum alloy upon solidification, such as when a casting is formed using the aluminum alloy. In this respect it has been reported that the formation of $\beta$-$Al_5FeSi$ intermetallic phase is closely related to the presence of a spurious dispersed (unaffiliated) microporosity in the casting microstructure.

Microporosity, while acceptable in some aluminum alloy structures, can be present challenges in certain applications. For example, surface-connected pores can impound and periodically shed contaminates collected form the environment in contact with surface-connected pores, potentially causing contamination problems in applications such as semiconductor device processing. Pores, both surface-connected as well as interior pores, can also limit strength of structures formed by aluminum alloys exhibiting high porosity, such as when iron containing precipitates develop at the grain boundaries bounding interior pores.

Various countermeasures exist to limiting microporosity in aluminum alloy structures. For example, manganese (Mn) concentration may limited in the aluminum alloy, typically such that manganese (Mn) concentration by weight percentage is about one-half iron (Fe) concentration by weight percentage in the aluminum alloy. In this respect it has been found that control of manganese (Mn) concentration promotes the formation of a co-eutectic alpha phase in the casting microstructure, which is generally referred to as a "Chinese script" morphology for its appearance under a microscope, resulting in a reduction of larger micropores in the cast microstructure results in a modest increase in tensile strength. However, the aluminum alloy melts to which manganese (Mn) has been added to improve the alpha phase shape to a "Chinese Script" morphology still typically contain both porosity and shrinkage defects (shrinkage porosity). As a consequence structures formed by such aluminum alloys may require further processing to limit the porosity, such as by polishing and/or coating surfaces bounding contamination sensitive environments, and/or by making the structure than otherwise required by the aluminum alloy.

Such systems and methods have generally been acceptable for their intended purpose. However, there remains a need for improved castable aluminum alloys, articles such as substrate transfer chambers for semiconductor processing systems formed by castable aluminum alloys, and methods of making articles such as substrate transfer chambers formed by castable aluminum alloys. The present disclosure provides a solution to this need.

SUMMARY OF THE DISCLOSURE

A substrate handling chamber body is provided. The substrate handling chamber body is formed from a castable aluminum alloy including a manganese (Mn) constituent and an iron (Fe) constituent. The castable aluminum alloy has a manganese (Mn) constituent-to-iron (Fe) constituent ratio that between about 1.125 and about 1.525 to limit microporosity and shrinkage porosity within the castable aluminum alloy forming the substrate handling chamber body.

In addition to one or more of the features described above, or as an alternative, further examples of the substrate handling chamber body may include that the iron (Fe) constituent is less than or equal to about 0.4% of the castable aluminum alloy by weight percentage.

In addition to one or more of the features described above, or as an alternative, further examples of the substrate handling chamber body may include that the castable aluminum alloy includes a copper (Cu) constituent, and that the copper (Cu) constituent is less or equal to about 0.1% of the castable aluminum alloy by weight percentage.

In addition to one or more of the features described above, or as an alternative, further examples of the substrate handling chamber body may include that the castable aluminum alloy includes one or more rare earth metal constituent to control grain size within the castable aluminum alloy.

In addition to one or more of the features described above, or as an alternative, further examples of the substrate handling chamber body may include the at least one rare earth metal included in the castable aluminum alloy is a strontium (Sr) constituent.

In addition to one or more of the features described above, or as an alternative, further examples of the substrate handling chamber body may include one or more rare earth metal constituent selected from a group including lanthanum (La), cerium (Ce), praseodymium (Pr), neodymium (Nd), and promethium (Pm); and that the strontium (Sr) constituent and the one or more rare earth metal constituent comprise no more than 5% of the castable aluminum alloy by weight percentage.

In addition to one or more of the features described above, or as an alternative, further examples of the substrate handling chamber body may include that the castable aluminum alloy includes a strontium (Sr) constituent, and that the strontium (Sr) constituent forms about 0.005% of the castable aluminum alloy by weight percentage.

In addition to one or more of the features described above, or as an alternative, further examples of the substrate handling chamber body may include that the castable aluminum alloy includes no other rare earth metal constituent beyond the strontium (Sr) constituent in more than a trace amount.

In addition to one or more of the features described above, or as an alternative, further examples of the substrate handling chamber body may include that the castable aluminum alloy is a 5083 aluminum alloy.

In addition to one or more of the features described above, or as an alternative, further examples of the substrate handling chamber body may include a surface of the substrate handling chamber has no pores greater than about 1 millimeter in width, that the surface of the substrate handling chamber has no more than 1 pore per 600 square centimeter area with a width that is between about 0.5 millimeters and about 1 millimeter in width, that the surface of the substrate handling chamber has no more than 10 pores per 600 square centimeter area having widths that about between about 0.2 millimeters and about 0.5 millimeters, and that the surface of the substrate handling chamber has no more than 100 pores per 600 square centimeter area having widths that are greater than about 0.2 millimeters.

In addition to one or more of the features described above, or as an alternative, further examples of the substrate handling chamber body may include that the iron (Fe) constituent forms between a non-trace amount and about 0.4% of the castable aluminum alloy by weight percentage, and that the manganese (Mn) constituent form between about 0.4% and about 1.0% of the castable aluminum alloy by weight percentage.

In addition to one or more of the features described above, or as an alternative, further examples of the substrate handling chamber body may include that the castable aluminum alloy further includes an aluminum (Al) constituent forming between about 92.4% and about 95.6% of the castable aluminum alloy by weight percentage; a chromium (Cr) constituent forming between about 0.05% and about 0.25% of castable aluminum alloy by weight percentage; a copper (Cu) constituent forming less than about 0.% of the castable aluminum alloy by weight percentage; and a magnesium (Mg) constituent forming between about 4% and about 4.9% of the castable aluminum alloy by weight percentage.

In addition to one or more of the features described above, or as an alternative, further examples of the substrate handling chamber body may include that the castable aluminum alloy further includes one or more of (a) a silicon (Si) constituent forming no more than about 0.4% of the castable aluminum alloy by weight percentage, (b) a titanium (Ti) constituent forming no more than about 0.15% of the castable aluminum alloy by weight percentage, (c) a zinc (Zn) constituent forming no more than about 0.25% of the castable aluminum alloy by weight percentage, (d) one or more rare earth constituent forming no more than 5% of the castable aluminum alloy by weight percentage.

In addition to one or more of the features described above, or as an alternative, further examples of the substrate handling chamber body may include that the manganese (Mn) constituent-to-iron (Fe) constituent ratio is between about between about 1.125 and about 1.225, or is between about 1.225 and about 1.325, or is between about 1.325 and about 1.425, or is between about 1.425 and about 1.525.

A semiconductor processing system is provided. The semiconductor processing system includes a process module, a substrate handling module with a substrate handling chamber body as described above connected to the process module, a load lock module connected to the substrate handling chamber body, and an equipment front-end module connected to the load lock and coupled therethrough to the process module. The castable aluminum alloy defines an interior surface of the substrate handing chamber body bounding an interior of the substrate handling chamber body. The castable aluminum alloy defines an interior surface of the substrate transfer chamber body having therein a plurality of surface-connected pores in communication with the interior of the substrate handling chamber body.

A method of making a substrate handling chamber body is provided. The method includes melting a plurality of alloy constituents to form a castable aluminum alloy, pouring the melted alloy constituents into a mold, and cooling the melted alloy constituents to form a substrate transfer chamber. The mold is a substrate transfer chamber body mold, the castable aluminum alloy comprises a manganese (Mn) constituent and an iron (Fe) constituent, and the castable aluminum alloy has a manganese (Mn) constituent-to-iron (Fe) constituent that between about 1.125 and about 1.525 to limit microporosity and shrinkage porosity within the castable aluminum alloy forming the substrate handling chamber body.

In addition to one or more of the features described above, or as an alternative, further examples of the method may include melting (a) an aluminum constituent, (b) a chromium (Cr) constituent, (c) a copper (Cu) constituent, and (d) a magnesium (Mg) constituent to form the castable aluminum alloy.

In addition to one or more of the features described above, or as an alternative, further examples of the method may include treating the melted alloy constituents by adding at least one of a strontium (Sr) constituent and one or more rare earth metal constituent to the melted alloy constituents.

In addition to one or more of the features described above, or as an alternative, further examples of the method may include treating the melted alloy constituents by adding a titanium (Ti) constituent to the melted alloy constituents.

In addition to one or more of the features described above, or as an alternative, further examples of the method may include heat curing the melted alloy constituents subsequent to pouring the melted alloy constituents into the mold.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
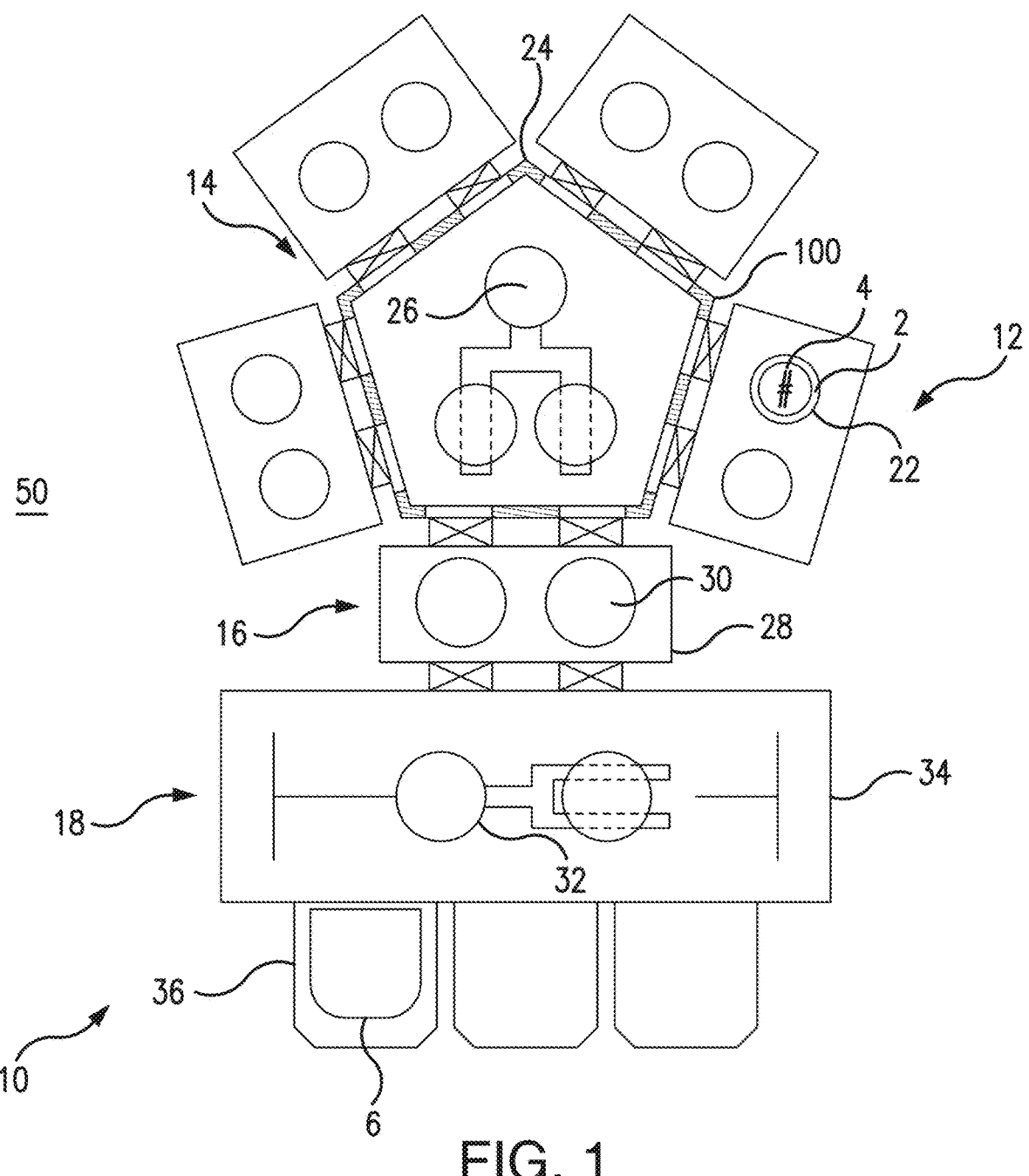
FIG. 1 is a plan view of a semiconductor processing system in accordance with the present disclosure, schematically showing a substrate handling chamber body formed from a castable aluminum alloy according to the present disclosure.
Figure 4:
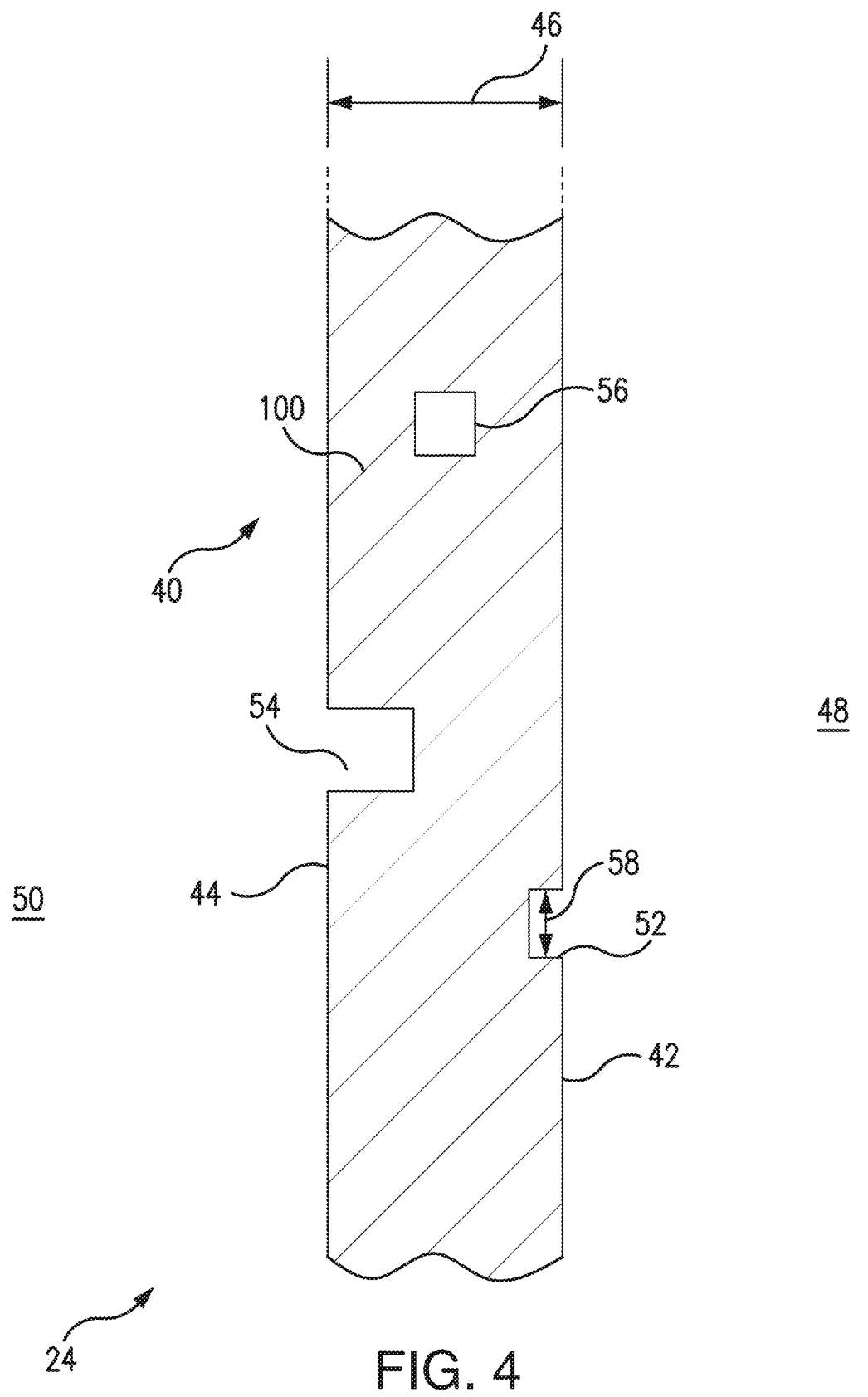
Figure 5:
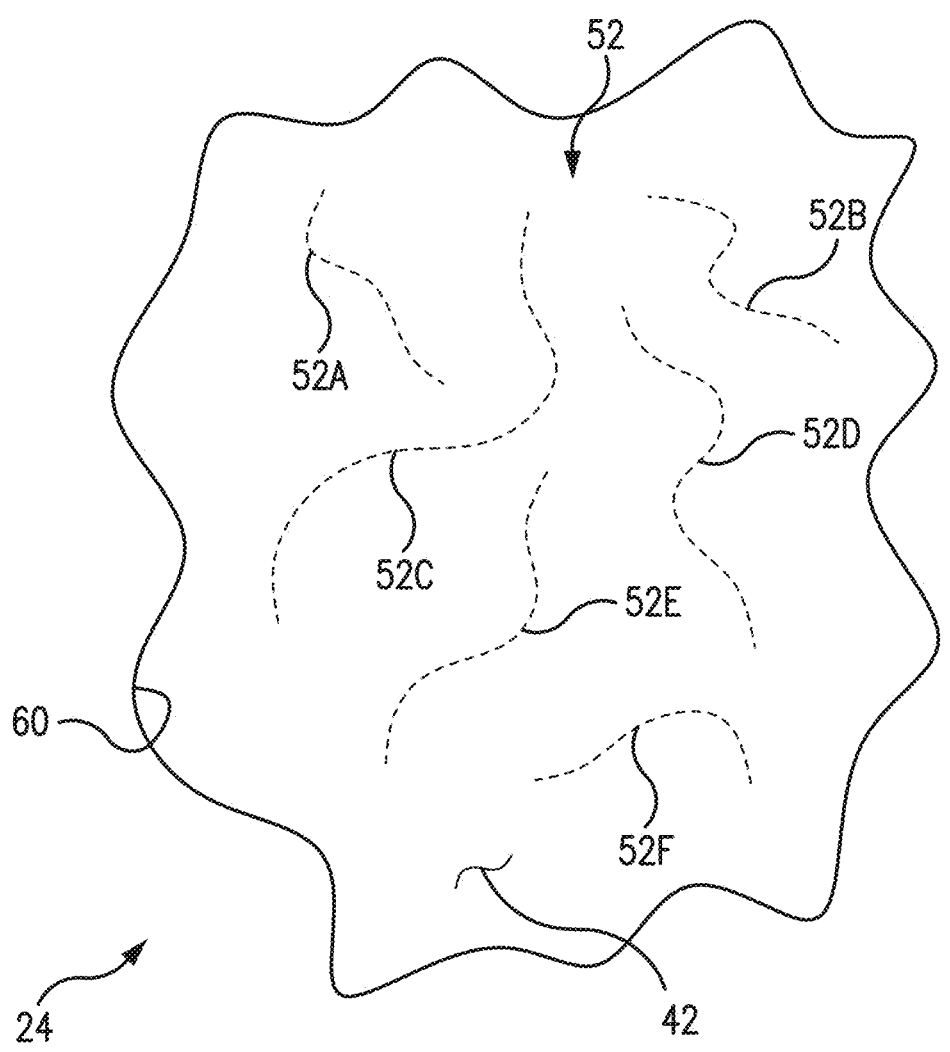
Figure 6:
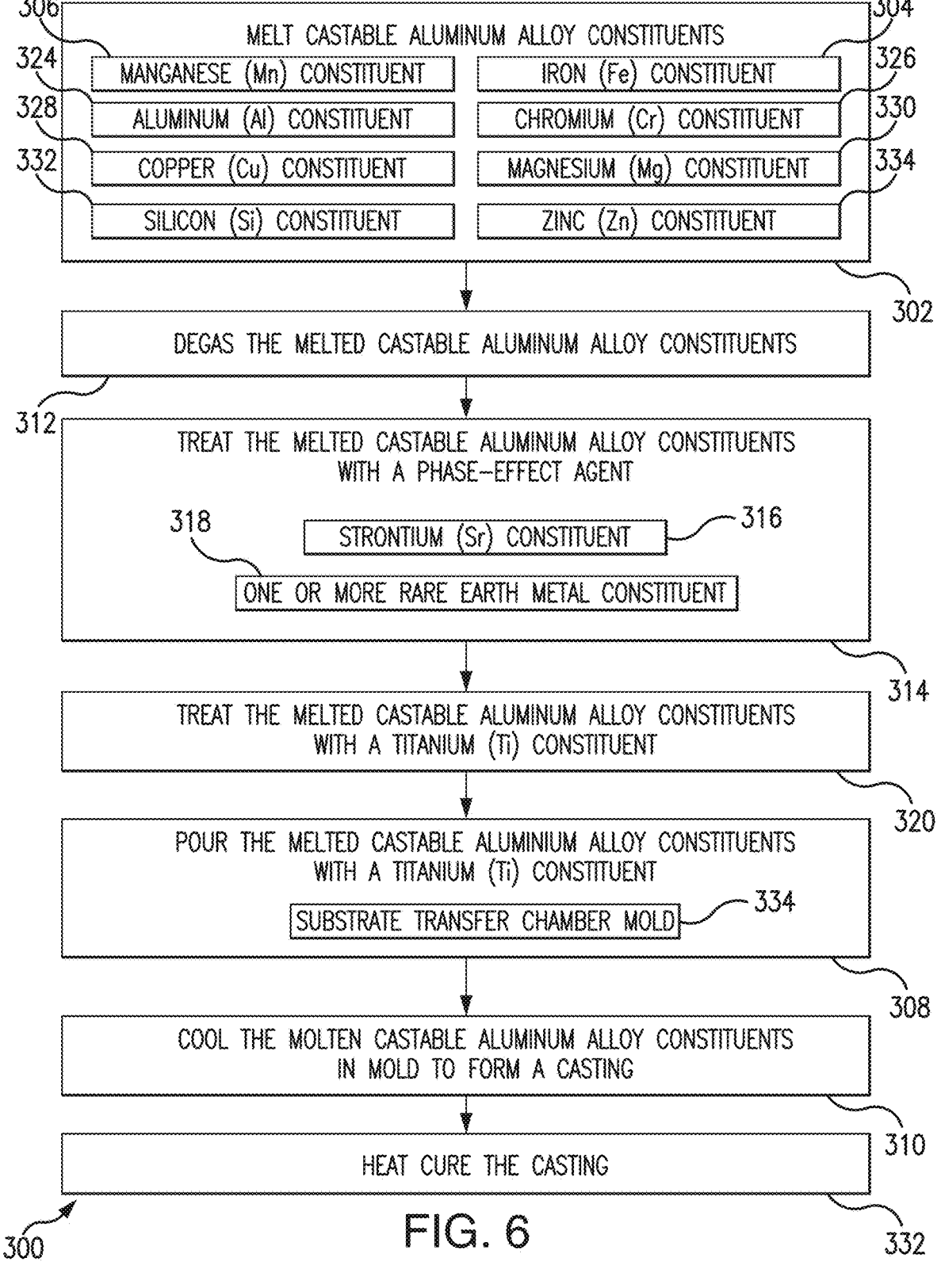

FIGS. 4 and 5 are sectional and plan views of a portion of the substrate handling chamber of FIG. 1 according to an example of the present disclosure, schematically showing pores defined within the castable aluminum alloy forming the substrate handling chamber body; and FIG. 6 is a block diagram of a method of making a substrate handling chamber body for a semiconductor processing system, showing operations of the method according to an illustrative and non-limiting example of the present disclosure.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a castable aluminum alloy forming a substrate handling chamber body of a transfer module in a semiconductor processing system in accordance with the present disclosure is shown in FIG. 1 and is designated generally by reference character 100. Other examples of substrate handling chamber bodies, semiconductor processing systems, and methods of making substrate handling chamber bodies for semiconductor processing systems in accordance with the present disclosure, or aspects thereof, are provided in FIGS. 2-6, as will be described. The systems and methods of the present disclosure may be used to fabricate structures for semiconductor processing systems, such as substrate handling chamber bodies employed to couple equipment front-end modules to process modules in semiconductor processing system used to deposit material layers onto substrates, though the present disclosure is not limited substrate transfer chamber bodies or to any particular type of semiconductor processing system in general.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide. As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

With reference to FIG. 1, a semiconductor processing system 10 is shown. The semiconductor processing system 10 includes one or more process module 12, a substrate handling module 14, a load lock module 16, and an equipment front-end module (EFEM) 18. The one or more process module 12 includes a process chamber body 20 housing a substrate support 22, is configured to deposit a material layer 4 onto a substrate 2 (e.g., a wafer) seated on the substrate support 22, and is connected to the substrate handling module 14. In the illustrated example the one or more process module 12 is one of four (4) dual-chamber process modules each connected to the substrate handling module 14. This is for illustration purposes only and is non-limiting. Although shown and described herein as having a dual-chamber process module arrangement, it is to be understood and appreciated that semiconductor processing systems having other process module arrangements, e.g., single or quad chamber arrangements, can also benefit from the present disclosure. As will also be appreciated by those of skill in the art in view of the present disclosure, semiconductor processing systems having fewer or additional process modules as well as those having process modules configured to perform operations other than material layer deposition (e.g., etching, polishing, and/or metrology) may also benefit from the present disclosure.

The substrate handling module 14 includes a substrate handling chamber body 24 and back-end substrate handling robot 26. The substrate handling chamber body 24 couples the process module 12 to the load lock module 16 and houses the back-end substrate handling robot 26. The back-end substrate handling robot 26 is supported for movement within the substrate handling chamber body 24 relative to the substrate handling chamber body 24 and is configured to transfer substrates, e.g., the substrate 2, between the load lock module 16 and the one or more process module 12. In the illustrated example the substrate handling module 14 is a singular substrate transfer module having a pentagonal shape. This is for illustration and description purposes only, and is non-limiting. As will be appreciated by those of skill in the art in view of the present disclosure, semiconductor processing systems having more one back-end substrate transfer module and/or having substrate transfer chambers with different shapes, e.g., having fewer than five (5) sides or more than five (5) sides, may also benefit from the present disclosure.

The load lock module 16 includes a load lock chamber body 28 and one or more transfer stage 30. The load lock chamber body 18 couples the substrate handling module 14 to the EFEM 18 and houses the one or more transfer stage 30. The one or more transfer stage 30 is configured to support there a substrate, e.g., the substrate 2, and is within movement envelopes of both the back-end substrate handling robot 26 and a front-end substrate handling robot 32 included in the EFEM 18. Although shown in FIG. 1 as having two (2) transfer stages, it is to be understood that semiconductor processing systems have fewer or additional transfer stages and remain within the scope of the present disclosure. In the illustrated example the load lock module 16 is a singular load lock module. This is for illustration and description purposes only, and is non-limiting, and as will further be appreciated by those of skill in the art in view of the present disclosure, the semiconductor processing system 10 may have more than one load lock module and/or pass-through module and remain within the scope of the present disclosure.

The EFEM 18 includes an enclosure 34, one or more load port 36, and the front-end substrate handling robot 32. The enclosure 34 couples the one or more load port 36 to the load lock module 16. The front-end substrate handling robot 32 is supported for movement within the enclosure 34 and is configured to transfer substrates, e.g., the substrate 2, between the one or more load port 36 and the load lock module 16. The one or more load port 36 is configured to seat thereon a pod 6, e.g., a standard mechanical interface pod or a front-opening unified pod, and may interface the semiconductor processing system 10 to a material handling system, such as an automated material handling system, for transfer of pods such as the pod 6 to and from the semiconductor processing system 10. Although shown and described herein as having three (3) load ports, it is to be understood and appreciated that semiconductor processing systems having fewer or additional load ports may also benefit from the present disclosure.

As has been explained above, aluminum alloys forming structures in semiconductor processing systems can, in some semiconductor processing systems, present shrinkage defects and/or surface-connected pores to the internal environment of various structures within the semiconductor processing system. Such shrinkage defects and surface-connected defects can, in some semiconductor processing systems, accumulate contamination—potentially reducing reliability of semiconductor devices fabricated using the semiconductor processing system in the event that contamination becomes mobilized, for example, during evacuation and/or venting of the semiconductor processing system. To limit such risk in the semiconductor processing system 10, one or more of the process chamber body 20, the substrate handling chamber body 24, and the load lock chamber body 28 are formed from the castable aluminum alloy 100. Advantageously, the castable aluminum alloy 100 has a relatively high manganese-to-iron ratio, e.g., greater 1 and preferably between about 1.125 and about 1.525, which limits size of pores (and thereby contamination impoundment) in surface facing spaces through which substrates are handling during transfer between the EFEM 18 and the process module 12.

Figure 2:
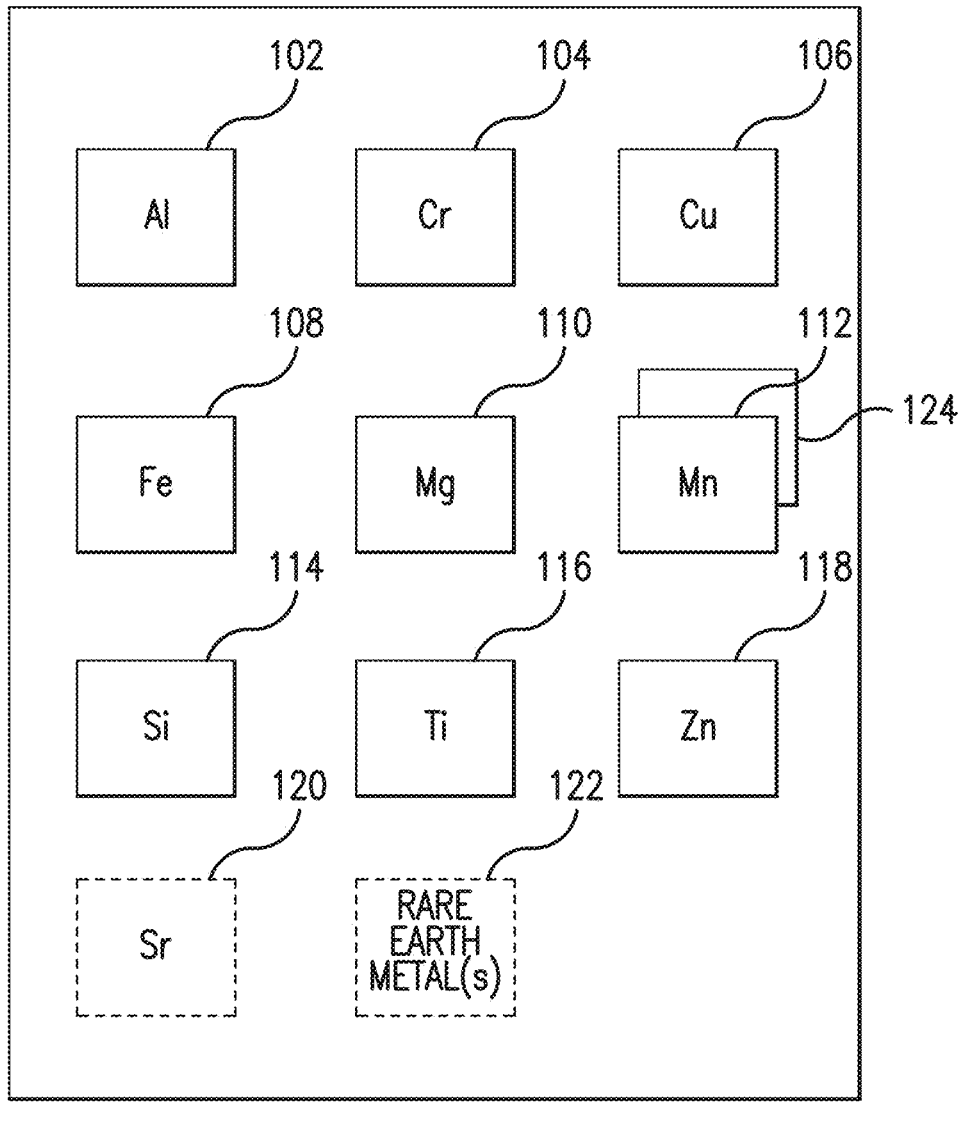
FIG. 2 is schematic view of the castable aluminum alloy forming the substrate handling chamber body of FIG. 1, showing composition of the castable aluminum alloy according to an examples of the present disclosure.

With reference to FIG. 2, the castable aluminum alloy 100 including associated elemental constituents is shown. The castable aluminum alloy 100 includes an aluminum (Al) constituent 102, a chromium (Cr) constituent 104, and a copper (Cu) constituent 106. The castable aluminum alloy 100 also includes an iron (Fe) constituent 108, a magnesium (Mg) constituent 110, and a manganese (Mn) constituent 112. It is contemplated that the castable aluminum alloy 100 further include a silicon (Si) constituent 114, an optional titanium (Ti) constituent 116, and a zinc (Zn) constituent 118. It is also contemplated that the castable aluminum alloy 100 may include an optional strontium (Sr) constituent 120 and/or one or more optional rare earth metal constituent 122. In certain examples, the castable aluminum alloy 100 may conform to a 5083 aluminum specification, for example, with respect to composition.

The aluminum (Al) constituent 102 may comprise between about 92.4 weight percent and about 95.6 weight percent of the castable aluminum alloy 100, the aluminum (Al) constituent 102 comprising the balance of the enumerated constituents of the castable aluminum alloy 100. The chromium (Cr) constituent 104 may comprise between about 0.05 weight percent and about 0.25 weight percent of the castable aluminum alloy 100. The copper (Cu) constituent 106 may comprise between none and no more than 0.1 weight percent of the castable aluminum alloy 100, for example between substantially none (e.g., a trace amount) and about 0.1 weight percent of the castable aluminum alloy 100. In certain examples of the present disclosure the copper (Cu) constituent 106 may comprise between about 0.1 weight percent and about 0.7 weight percent of the castable aluminum alloy 100, or between about 0.07 weight percent and about 0.04 weight percent of the castable aluminum alloy 100, or even between about 0.01 weight percent and about 0.04 weight percent of the castable aluminum alloy 100.

The iron (Fe) constituent 108 may comprise less than about 0.4 weight percent of the castable aluminum alloy 100 and in this respect may, in certain examples of the present disclosure, include a non-zero weight percentage or non-trace weight percentage of the castable aluminum alloy 100. In certain examples of the present disclosure the iron (Fe) constituent 108 may comprise between about 0.4 weight percent and about 0.3 weight percent of the castable aluminum alloy 100, or between about 0.3 weight percent and about 0.2 weight percent of the castable aluminum alloy 100, or between about 0.2 weight percent and about 0.1 weight percent of the castable aluminum alloy 100, or even between about 0.1 and about 0.01 weight percent of the castable aluminum alloy 100.

The magnesium (Mg) constituent 110 of the castable aluminum alloy 100 may comprise between about 4.0 weight percent and about 4.9 weight percent of the castable aluminum alloy 100. The manganese (Mn) constituent 112 of the castable aluminum alloy 100 may comprise between about 0.4 weight percent and about 1.0 weight percent of the castable aluminum alloy 100. In certain examples of the present disclosure the manganese (Mn) constituent 112 may comprise between about 0.4 weight percent and about 0.55 weight percent of the castable aluminum alloy 100, or between about 0.55 weight percent and about 0.7 weight percent of the castable aluminum alloy 100, or between about 0.7 weight percent and about 0.85 weight percent of the castable aluminum alloy 100, or even between about 0.85 weight percent and about 1.0 weight percent of the castable aluminum alloy 100. It is contemplated that castable aluminum alloy 100 comprise a manganese (Mn) constituent-to-iron (Fe) constituent ratio 124 that is between about 1.125 and about 1.525 to limit at least one of microporosity and shrinkage with a structure, e.g., the substrate handling chamber body 24 (shown in FIG. 1), formed by the castable aluminum alloy 100. In this respect it is contemplated that the manganese (Mn) constituent-to-iron (Fe) constituent ratio 124 may be between about 1.125 and about 1.225, or between about 1.225 and about 1.325, or between about 1.325 and about 1.425, or even between about 1.425 and about 1.525, as also shown with box 124.

The silicon (Si) constituent 114 of the castable aluminum alloy 100 may comprise between none and no more than about 0.4 weight percent of the castable aluminum alloy 100, for example between substantially none (e.g., a trace amount) and about 0.4 weight percent of the castable aluminum alloy 100. In certain examples of the present disclosure the silicon (Si) constituent 114 may comprise between a trace amount and about 0.1 weight percent of the castable aluminum alloy 100, or between about 0.1 weight percent and about 0.2 weight percent of the castable aluminum alloy 100, or between about 0.2 weight percent and about 0.3 weight percent of the castable aluminum alloy 100, or even between about 0.3 weight percent and about 0.4 weight percent of the castable aluminum alloy 100. The titanium (Ti) constituent 116 may comprise between none and no more than about 0.15 weight percent of the castable aluminum alloy 100, for example between substantially none (e.g., a trace amount) and about 0.15 weight percent of the castable aluminum alloy 100. In certain examples of the present disclosure the titanium (Ti) constituent 116 may comprise between a trace amount and about 0.05 weight percent of the castable aluminum alloy 100, or between about 0.05 weight percent and about 0.10 weight percent of the castable aluminum alloy 100, or even between about 0.1 weight percent and about 0.15 weight percent of the castable aluminum alloy 100. The zinc (Zn) constituent 118 may comprise between none and no more than about 0.25 weight percent of the castable aluminum alloy 100, for example between substantially none (e.g., a trace amount) and about 0.25 weight percent of the castable aluminum alloy 100. In certain examples of the present disclosure the zinc (Zn) constituent 118 may comprise between a trace amount and about 0.08 weight percent of the castable aluminum alloy 100, or between about 0.08 weight percent and about 0.16 weight percent of the castable aluminum alloy 100, or even between about 0.16 weight percent and about 0.25 weight percent of the castable aluminum alloy 100.

The strontium (Sr) constituent 120 may comprise between none and no more than about 0.05 weight percent of the castable aluminum alloy 100, for example between substantially none (e.g., a trace amount) and about 0.05 weight percent of the castable aluminum alloy 100. In certain examples, the castable aluminum alloy 100 may include one or more rare earth metal constituent 122. The one or more rare earth metal constituent 122 may accompany the strontium (Sr) constituent 120 in the composition of the castable aluminum alloy 100 or may be present in the castable aluminum alloy 100 in the absence of the strontium (Sr) constituent 120. Non-limiting examples of one or more rare earth metal constituent 122 include cerium (Ce), lanthanum (La), praseodymium (Pr), neodymium (Nd), and promethium (Pm), which individually or in combination may form no more than about 5 weight percent of the castable aluminum alloy 100. In certain examples of the present disclosure the one or more rare earth metal constituent 122 may comprise between a trace amount and about 1.5 weight percent of the castable aluminum alloy 100, or between about 1.5 weight percent and about 3.0 weight percent of the castable aluminum alloy 100, or even between about 3.0 weight percent and about 5 weight percent of the castable aluminum alloy 100.

In certain examples of the present disclosure the castable aluminum alloy 100 may be a 5083 aluminum alloy comprising the chromium (Cr) constituent 104 at a weight percentage that is between about 0.05% and about 0.25% of the castable aluminum alloy 100, the copper (Cu) constituent 106 at a weight percentage that is less than about 0.1% of the castable aluminum alloy 100, the magnesium constituent 110 at a weight percentage that is between about 4.0% and about 4.9% of the castable aluminum alloy 100, the zinc (Zn) constituent 118 at a weight percentage that is less than about 0.25% of castable aluminum alloy 100, the silicon (Si) constituent 114 at a weight percentage that is less than about 0.40% of the castable aluminum alloy 100, the titanium (Ti) constituent 116 at a weight percentage that is than about 0.15% of the castable aluminum alloy 100, the iron (Fe) constituent 108 at a weight percentage that is less than about 0.4% of the castable aluminum alloy 100, and the manganese (Mn) constituent 112 at a weight percentage that between about 0.4% and about 1.0% of the castable aluminum alloy 100. In accordance with certain examples of the present disclosure, the manganese (Mn) constituent-to-iron (Fe) constituent ratio 124 may be greater than or equal to 1 to reduce intermetallic $(FeMn)Al_{16}$, $(MgMn)_3 Al_{10}$, $(FeMnMg)_2SiAl_{15}$, $(FeMn)_3Si_2Al_{15}$, $Mn_3Si_2Al_{15}$ type formations within the alloy to limit microporosity within the castable aluminum alloy 100 and improve tensile strength of a casting, e.g., the substrate handling chamber body 24 (shown in FIG. 1), made from the castable aluminum alloy 100. Castings, such as for substrate handling chambers in semiconductor processing systems, may be formed in vertical molds using continuous casting techniques by melting the constituent of castable aluminum alloy 100, introducing the melted alloy into a mold with a density index less than 1.5 at pouring, and solidifying the melted alloy in the mold to form a casting, the manganese (Mn) constituent-to-iron (Fe) constituent ratio 124 limiting porosity and increasing tensile strength of the casting.

Figure 3:
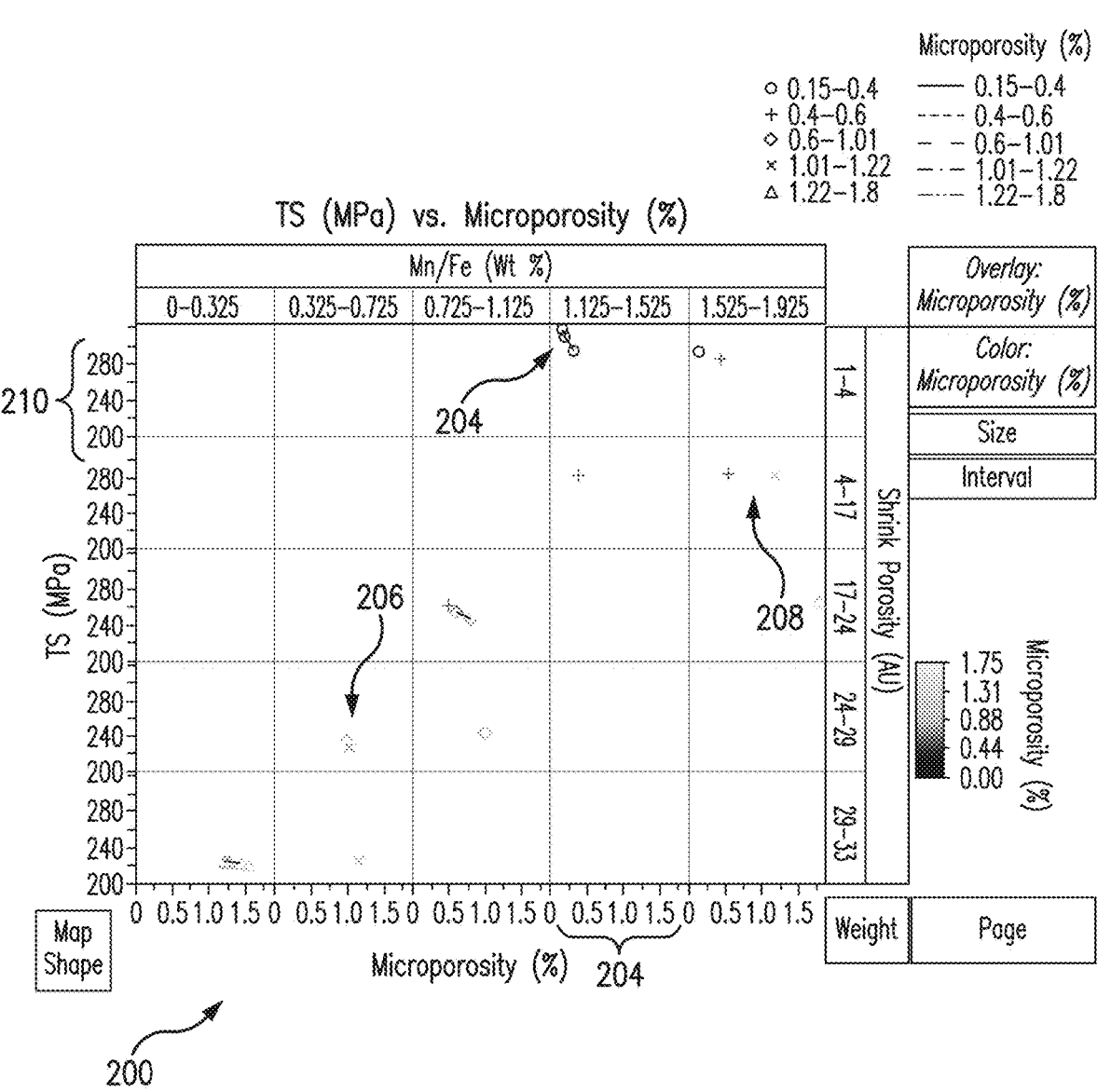
FIG. 3 is chart showing properties of the castable aluminum alloy of FIG. 1 according to the present disclosure, showing tensile strength and microporosity versus a manganese (Mn) constituent-to-iron (Fe) constituent ratio of the castable aluminum alloy.

With reference to FIG. 3, a chart 200 showing porosity and ultimate tensile strength as functions of the manganese (Mn) constituent-to-iron (Fe) constituent ratio 124 (shown in FIG. 2) is shown. As shown with arrow 202 and bracket 204, manganese (Mn) constituent-to-iron (Fe) constituent ratios within the range of about 1.125 and about 1.525 exhibit relatively low levels of microporosity in relation the aluminum alloys of similar composition having manganese (Mn)-to-iron (Fe) ratios that are less than 1.125 and greater than 1.525, as shown with arrows 206 and 208. This reduces (or eliminates) the tendency of structures formed by the castable aluminum alloy 100, e.g., the substrate transfer chamber (shown in FIG. 1) to impound contaminate within surface pores defined within the surface of such structures. Limiting contamination impoundments in turn limits (or eliminates) the need to implement countermeasures to attend to such contamination, for example, through surface treatments such as nickel plating and/or cyclic cleaning or etching of structure surfaces to remove impounded contaminate.

As also shown with arrow 202 and bracket 210, manganese (Mn) constituent-to-iron (Fe) constituent ratios within the range of about 1.125 and about 1.525 also exhibit relatively high ultimate tensile strength levels in relation the aluminum alloys of similar composition having manganese (Mn)-to-iron (Fe) ratios that are less than 1.125 and greater than 1.525. The relatively high ultimate tensile strength allows structures formed from the castable aluminum alloy 100 to be relatively light weight in comparison to aluminum alloys having manganese (Mn) constituent-to-iron (Fe) constituent ratios, e.g., the substrate handling chamber body 24 (shown in FIG. 1), potentially limiting size and/or cost of such structures.

With reference to FIG. 4, a portion of the substrate handling chamber body 24 is shown. The substrate handling chamber body 24 includes a wall portion 40 having an interior surface 42, an exterior surface 44, and a thickness 46 each defined by the castable aluminum alloy 100. The interior surface 42 of the substrate handling chamber body 24 bounds an interior 48 of the substrate handling chamber body 24 and may oppose (e.g., face) the back-end substrate handling robot 26 (shown in FIG. 1). The exterior surface 44 of the substrate handling chamber body 24 separates an external environment 50 outside of semiconductor processing system 10 (shown in FIG. 1) from the interior 48 of the substrate handling chamber body 24, and is spaced apart from the interior surface 42 of the substrate handling chamber body 24 by the thickness 46 of the substrate handling chamber body 24. In certain examples, the thickness 46 may be a reduced thickness wall relative to a wall formed from 5083 aluminum due to the aforementioned relatively low level of porosity in the castable aluminum alloy 100.

In certain examples, the interior surface 42 of the wall portion 40 may define therein one or more interior surface pore 52. The one or more interior surface pore 52 may be surface-connected, and in this respect may be fluidly coupled to the interior 48 of the substrate handling chamber body 24. In accordance with certain examples, the exterior surface 44 of the wall portion 40 may define therein one or more exterior surface pore 54. The one or more exterior surface pore 54 may also be surface connected and in this respect may be fluidly coupled to the external environment 50 outside of the semiconductor processing system 10 (shown in FIG. 1). It is also contemplated that the wall portion 40 may define therein one or more interior pore 56. The one or more interior pore 56 may be similar to the one or more interior surface pore 52 and/or the one or more exterior surface pore 54 (e.g., in terms of width and/or longitudinal length), and may be further fluidly separated from the interior 48 of the substrate handling chamber body 24 as well as the external environment 50 outside of the semiconductor processing system 10. In certain examples, the interior surface 42 of the substrate handling chamber body 24 may have no pores with a width greater than about 1 millimeters. In this respect the interior surface pore 52 may have a width 58 and the width 58 may be less than about 1 millimeter.

With reference to FIG. 5, a portion of the interior surface 42 of the substrate handling chamber body 24 is shown. In the illustrated example the one or more interior surface pore 52 comprises a plurality of interior surface pores 52A-52F defined within an interior surface area 60. In certain examples, the interior surface 42 of the substrate handling chamber body 24 may have no more than 1 pore per 600 square centimeter area with a width that is between about 0.5 millimeters and about 1 millimeter. In such examples the interior surface area 60 may be representative of an entirety of the interior surface 42 bounding the interior 48 (shown in FIG. 1) of the substrate handling chamber body 24 and the plurality of interior surface pores 52A-52F may pores within the surface area each having widths that less than 1 millimeter.

In accordance with certain examples, the interior surface 42 of the substrate handling chamber body 24 may have no more than 10 pores per 600 square centimeter area having widths that about between about 0.2 millimeters and about 0.5 millimeters. In such examples the interior surface area 60 may be representative of an entirety of the interior surface 42 bounding the interior 48 of the substrate handling chamber body 24 and the plurality of interior surface pores 52A-52F may be among no more than 10 pores per 600 square centimeter area having widths that about between about 0.2 millimeters and about 0.5 millimeters.

It is also contemplated that, in accordance with certain examples, the interior surface 42 of the substrate handling chamber body 24 may have no more than 100 pores per 600 square centimeter area having widths that are greater than about 0.2 millimeters. In such examples the interior surface area 60 may be representative of an entirety of the interior surface 42 bounding the interior 48 of the substrate handling chamber body 24 and the plurality of interior surface pores 52A-52F may be among no more than 100 pores per 600 square centimeter area having widths that are greater than about 0.2 millimeters.

With reference to FIG. 6, a method 300 of making a substrate transfer chamber, e.g., the substrate handling chamber body 24 (shown in FIG. 1), is shown. The method 300 generally includes melting constituents of a castable aluminum alloy, e.g., the castable aluminum alloy 100 (shown in FIG. 1), as shown with box 302. It is contemplated melting the aluminum alloy constituents include melting an iron (Fe) constituent, e.g., the iron (Fe) constituent 108 (shown in FIG. 2), as shown with box 304. It is also contemplated that melting the aluminum alloy constituents includes melting a manganese (Mn) constituent, e.g., the manganese (Mn) constituent 306 (shown in FIG. 2), as shown with box 306. It is further contemplated that melting the alloy constituents include melting sufficient amounts of the manganese (Mn) constituent and the iron (Fe) constituent such that the castable aluminum alloy have a manganese (Mn) constituent-to-iron (Fe) constituent ratio that is between about 1.125 and about 1.525, as also shown with box 302.

The method 300 also includes pouring the melted (e.g., molten) constituents into a mold, as shown with box 308, and thereafter cooling the melted castable aluminum alloy constituents, as shown with box 310. In certain examples, the method 300 may include degassing the melted alloy constituents, as shown with box 312. In accordance with certain examples, the melted castable aluminum alloy constituents may be treated with a phase-effect agent, as shown with box 314. The phase-effect agent may include a strontium (Sr) constituent, e.g., the strontium (Sr) constituent 120 (shown in FIG. 2), as shown with box 316. Alternatively (or additionally), the phase-effect agent may include one or more rare earth element, e.g., the rare earth metal constituent 122 (shown in FIG. 2), as shown with box 318. It is contemplated that the melted castable aluminum alloy constituent may be treated by adding titanium to the melted castable aluminum alloy constituents, e.g., the titanium (Ti) constituent 116 (shown in FIG. 1), as shown with box 320. It is also contemplated that the casting formed from the castable aluminum alloy may be heat cured once cooled, as shown with box 322. It is further contemplated that the mold may be a mold for a substrate transfer chamber, e.g., the substrate handling chamber body 24 (shown in FIG. 1), as shown with box 334.

Melting 302 the castable aluminum constituents may include melting an aluminum (Al) constituent, e.g., the aluminum (Al) constituent 102 (shown in FIG. 2), to form the melted castable aluminum alloy as shown with box 324. Melting 302 the castable aluminum constituents may include melting a chromium constituent, e.g., the chromium (Cr) constituent 104 (shown in FIG. 2), to form the melted castable aluminum alloy, as shown with box 326. Melting 302 the castable aluminum constituents may include melting a copper constituent, e.g., the copper (Cu) constituent 106 (shown in FIG. 2), to form the melted castable aluminum alloy, as shown with box 328. Melting 302 the castable aluminum constituents may include melting a magnesium constituent, e.g., the magnesium (Mg) constituent 110 (shown in FIG. 2), to form the melted castable aluminum alloy, as shown with box 330. Melting 302 the castable aluminum constituents may include melting a silicon constituent, e.g., the silicon (Si) constituent 114 (shown in FIG. 2), to form the melted castable aluminum alloy, as shown with box 332. Melting 302 the castable aluminum constitu 13
14 ents may include melting a zinc constituent, e.g., the zinc (Zn) constituent 118 (shown in FIG. 2), to form the melted castable aluminum alloy, as shown with box 334.

Aluminum alloys, such as 5083 aluminum alloys, are commonly employed to form various types of structures. 5083 aluminum alloys generally include iron (Fe), which enters into the alloy when the 5083 aluminum alloy is prepared from bauxite-containing ferric oxide. Manganese (Mn) is typically included in such alloys as a desired alloying element because of its strong beneficial effect on the morphology of iron-bearing intermetallic phases present in the casting microstructure. In particular, it has been reported that the formation of a β-Al$_5$FeSi intermetallic phase is closely related to the presence of a spurious dispersed (unaffiliated) microporosity in the casting microstructure. As a consequence, the Mn concentration of many castable aluminum alloys is typically limited such that controlled to be equal to about half the Fe concentration of the alloy. It has been found that control of the Mn concentration for this purpose promotes the formation of a co-eutectic alpha phase in the casting microstructure, which is generally referred to as a "Chinese script" morphology for its appearance under a microscope, and a reduction of larger micropores in the cast microstructure results in a modest increase in tensile strength. However, the alloy melts to which the Mn has been added to improve the alpha phase shape to a "Chinese Script" morphology still contain both porosity and shrinkage defects (shrinkage porosity). Such porosity and shrinkage defects can, when present on interior surfaces of semiconductor processing system structures, accumulate contamination.

In certain examples of the present disclosure, pourable aluminum alloys are provided in weight % for structure in semiconductor processing systems such as substrate handling chambers. In accordance with certain examples of the present disclosure, aluminum alloys may have a chemical composition selected to meet an AA5083 ASM International material standard. In this respect the chemical composition of the aluminum alloy may be, in weight percentage, aluminum (between about 92.4% and about 95.6%), chromium (between about 0.05% and about 0.25%), copper (less than or equal to about 0.1%), iron (less than or equal to about 0.4%), magnesium (between about 4.0 percent and about 4.9%), manganese (between about 0.4% and about 1.0%), silicon (less than or equal to about 0.40%), titanium (less than or equal to about 0.15%), zinc (less than or equal to about 0.25%), other constituents individually (less than or equal to about 0.0%), and other constituents in total (less than or equal to 0.15%). In further respect, the weight ratio of manganese to iron is at least 1.0, and in examples where iron equals or exceeds 0.4% both porosity is reduced and tensile strength is improved in castings formed from the aluminum alloy relative to 5083 aluminum alloys.

In certain examples of the present disclosure, improved casting made of the above castable aluminum alloys, as well as improved methods of casting the same, whereby both microporosity and shrinkage porosity (macroporosity) in castings is reduced, are provided. In accordance with certain examples, the present disclosure may provide improved mechanical properties and reduced porosity in cast structures without controlled manganese-to-iron ratios. Further advantages and features of the present disclosure will become apparent from the following description.

As shown in FIG. 3, the ratio of manganese-to-iron ratio within aluminum alloys influences both porosity within the casting and ultimate tensile strength of the casting. The microporosity and shrinkage porosity are shown on the x-axis and y-axis, respectively, and are expressed as the average volume percent of the specimens; the tensile strength is expressed as MPa. Measurements acquired at four different indicated positions on a block formed using the lost foam casting process and using a copper-containing aluminum alloy having a composition as described above, which has a manganese-to-iron weight ratio range extending from 0.0 to 1.75. Each data point shown in FIG. 3 represents an average of ten (10) samples taken from cast cylinder blocks. The effect of the manganese-to-iron eight ratio on mechanical properties of tensile specimens cut from the cylinder blocks cast. The experimental data was acquired from the cylinder blocks after were heat treated to either the T5 or T6 condition and 10 Tensile test specimen bodies were cut out of the head top surface area of the block for each heat treatment condition.

In certain examples of the present disclosure, aluminum alloys of the present disclosure may optionally contain strontium (Sr) up to about 0.05% by weight of alloy and/or a rare earth metal or a combination of rare earth metals including up to about 5 wt.-% of the alloy. Examples of suitable rare earth elements include an atomic number of 58 to 64 of the periodic table. These alloying elements modify the eutectic aluminum-silicon phase to the formation of a primary silicon phase prevent and/or modify intermetallic phases. Preferred rare earth metal elements for optional inclusion in castings formed from alloys of the present disclosure include, but are not limited to, cerium (Ce), lanthanum (La), praseodymium (Pr), neodymium (Nd), and/or promethium (Pm). However, samarium (Sm), europium (Eu), and/or gadolinium (Gd) are also contemplated and remain within the scope of the present disclosure.

The control of the manganese-to-iron weight ratio within the aluminum alloys according to the present disclosure can provide alloys that are significantly cheaper relative to iron-containing aluminum alloys (e.g., alloys having iron (Fe) weight percentages greater than about 0.4 weight percentage) and/or aluminum alloys containing greater amounts of manganese (e.g., aluminum alloys containing manganese greater 1.0%) for high strength, relatively low microporosity and/or macroporosity, and improved mechanical properties for obtained from the castings formed without control of the manganese-to-iron weight ratio in the aluminum alloy.

Melting of the aluminum alloy constituents may be accomplished in an oven such as a coreless induction oven, a resistance oven, a flame oven or a gas-fired hollow furnace made of clay-graphite or silicon carbide. A flux including (e.g., consisting of or consisting essentially of) contaminated or slag-rich filling material may be employed in certain types of melt. No special furnace atmosphere may be required, and the alloy constituents may be melted in ambient air. Once melted, the casting may be formed using a conventional aluminum casting technique, such blowing out the melt with dry argon or nitrogen by a rotary degasser, degassed. A degassing process, such as halogen gas degassing process may be employed. Chlorine or fluorine or halogen salts may be included to facilitate the removal of impurities. Preferably, motion of the melt may be limited (e.g., motionless) to limit turbulence, limiting (or minimizing) hydrogen gas uptake.

Once the melted aluminum alloy constituents have been degassed and cleaned, the melted aluminum alloy constituents may be treated to modify the eutectic aluminum-silicon phase and/or intermetallic phase effect. For example, a strontium (Sr) constituent and/or one or more rare earth metal constituents may be added to the melted castable aluminum alloy. The strontium (Sr) constituent may be added using an aluminum-strontium master alloy, for example, an aluminum-strontium master alloy having an 90% aluminum and 10% strontium by weight percentage aluminum-strontium alloy. The master alloy (or alloys) be added during the last stages of the constituent melting process, e.g., during degassing, the master alloy added to the melt being free of halogens in some examples. The gas content of the melted aluminum alloy constituents may have a density index of less than 1.5 at the time of pouring into the casting mold.

Finally, immediately before pouring, the melted castable aluminum alloy can be treated with a titanium-boron master alloy, the titanium-boron master alloy contributing a titanium (Ti) constituent to the castable aluminum alloy in a weight percentage that this between about 0.15% and about 0.1% of the castable aluminum alloy, the treatment refining grain size in castings formed using the castable aluminum alloy. As will be appreciated by those of skill in the art inv view of the present disclosure, treatment of the castable aluminum alloy with titanium may not be required in applications where grain refinement is unnecessary in castings formed using the castable aluminum alloy. In certain examples, superheating of the melted castable aluminum alloy constituents may be varied from less than about 50 degrees Fahrenheit to more than 500 degrees Fahrenheit. As will be appreciated by those of skill in the art in view of the present disclosure, relatively low superheating temperatures may minimize microporosity in cast articles formed using the castable aluminum alloy. As will also be appreciated by those of skill in the art in view of the present disclosure, relatively high superheat temperatures may provide refinement of the intermetallic phases in the microstructure of the casting, which provides advantageous mechanical properties desired in certain applications.

The melted aluminum alloy constituents may be poured into any suitable mold, which may be made by a variety of known molding processes. Molds may include without limitation bonded sand molds, metal molds, die casting molds, or investment casting molds. Sand molds may include metal mold with features to facilitate directional solidification and/or to locally refine casting microstructures in certain critical areas of the casting. In the case of sand molds, aftertreatment processes may be employed to remove excess sand from the casting after removal from the mold, for example, by sandblasting. Aftertreatment methods may also include the removal of gate sections of the casting. Castings may be assessed for damage by certain nondestructive tests, such as X-ray examination, dye penetration test or ultrasonic testing by non-limiting example. Such tests may be performed to asses porosity associated with casting shrinkage during solidification, and may further asses composition consistency of castable aluminum alloy forming the casting and/or shape of the casting, such as at fiducial features defined by the casting employed to asses casting shape.

Castings made of the aluminum alloys of the present disclosure may be heat treated to improve the mechanical properties, such as by dispersion hardening mechanisms. Such dispersion hardness heat treatments include but not limited on the T5 compensation, T6 compensation and T7 compensation. The T5 compensation (or tempering) may include heat curing the casting formed from the castable aluminum alloy, for example, at an intermediate temperature of between about 300 degrees Fahrenheit and about 450 degrees Fahrenheit, during a twelve (12) hour interval or longer. Challenging casting applications may require exceeding the breaking strength of the T6 coating, potentially requiring a heat treatment solution at a temperature close to but below the solid state temperature of castable aluminum alloy for periods typically between 4 and 12 hours.

Cooling the casting formed by the castable aluminum alloy may be accomplished by quenching the casting in a liquid such as water, oil, a polymer, and/or fast-moving air flow. Such a quench cools the heat treated casting by the critical temperature regime, usually to a temperature between about 450 degrees Fahrenheit and about 850 degrees Fahrenheit. After cooling, the casting may remain for between about 1 hour and about 24 hours at room temperature, and may thereafter be returned to one intermediate temperature similar to the T5 temper heated. In applications where dimensional stability is important, T7 compensation may be employed. This remuneration is similar T6 compensation, except that the heat-cure cycle either at higher temperatures and or over longer time takes place to a slightly softer condition with a higher dimensional stability to reach.

As shown in FIG. 3, an unexpected "process window" within ranges of manganese-to-iron weight percentages ratios between 1.125 and about 1.525 for the above-described castable aluminum alloys where, unexpectedly, microporosity and shrinkage porosity (macroporosity) are minimized while the tensile strength is maximized. Notably, the mechanical properties in the "process window" are significant over the mechanical properties exhibited by aluminum alloys having both lower and higher manganese-to-iron weight ratios. To further advantage, the additional manganese associated with the above-described "process window" of manganese-to-iron ratios of the present disclosure may further limit cost of the castable aluminum alloy due to the tolerance iron content within castable aluminum alloy (e.g., by avoiding the need to employ techniques to limit iron content), while maintaining reduced microporosity and macroporosity, as well as improved mechanical properties.

The breadth or extent of the "process window" depends on various factors, including iron concentration, silicon concentration, silicon eutectic point modifiers of the alloy and the cooling rate of the molten alloy after casting in the mold while it solidifies there in silicon concentrations in the above alloy, the "process window" reduced, without eutectic modification, the "process window" is deeper, and with faster cooling rates of the molten alloy in the mold, the "process window" is increased. Curves of mechanical properties like those in FIG. 3 may be produced for other families of castable aluminum alloys to determine the "process window" of the Mn/Fe ratio and to obtain the benefits of the practice of the present disclosure.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A semiconductor processing system, comprising:
a process module;
a substrate handling module with a substrate handling chamber body formed from a castable aluminum alloy comprising a manganese (Mn) constituent and an iron (Fe) constituent, wherein the castable aluminum alloy has a manganese (Mn) constituent-to-iron (Fe) constituent ratio that between about 1.125 and about 1.525 to limit microporosity and shrinkage porosity within the castable aluminum alloy forming the substrate handling chamber body, the substrate handling chamber body connected to the process module;
wherein the castable aluminum alloy defines an interior surface of the substrate handing chamber body bounding an interior of the substrate handling chamber body; and
wherein the castable aluminum alloy defines an interior surface of the substrate transfer chamber body having therein a plurality of surface-connected pores in communication with the interior of the substrate handling chamber body.

2. The semiconductor processing system of claim 1, wherein the iron (Fe) constituent is less than or equal to about 0.4% of the castable aluminum alloy by weight percentage.

3. The semiconductor processing system of claim 1, wherein the castable aluminum alloy comprises a copper (Cu) constituent, wherein the copper (Cu) constituent is less or equal to about 0.1% of the castable aluminum alloy by weight percentage.

4. The semiconductor processing system of claim 1, wherein the castable aluminum alloy comprises one or more rare earth metal constituent to control grain size within the castable aluminum alloy.

5. The semiconductor processing system of claim 4, wherein the one or more rare earth metal comprises a strontium (Sr) constituent.

6. The semiconductor processing system of claim 5, further comprising one or more rare earth metal constituent selected from a group including lanthanum (La), cerium (Ce), praseodymium (Pr), neodymium (Nd), and promethium (Pm); wherein the strontium (Sr) constituent and the one or more rare earth metal constituent comprise no more than 5% of the castable aluminum alloy by weight percentage.

7. The semiconductor processing system of claim 1, wherein the castable aluminum alloy comprises a strontium (Sr) constituent, wherein the strontium (Sr) constituent forms about 0.005% of the castable aluminum alloy by weight percentage.

8. The semiconductor processing system of claim 7, wherein the castable aluminum alloy comprises no other rare earth metal constituent beyond the strontium (Sr) constituent in more than a trace amount.

9. The semiconductor processing system of claim 1, wherein the castable aluminum alloy is a 5083 aluminum alloy.

10. The semiconductor processing system of claim 1, wherein a surface of the substrate handling chamber body has no pores greater than about 1 millimeter in width, wherein the surface of the substrate handling chamber body has no more than 1 pore per 600 square centimeter area with a width that is between about 0.5 millimeters and about 1 millimeter, wherein the surface of the substrate handling chamber body has no more than 10 pores per 600 square centimeter area having widths that about between about 0.2 millimeters and about 0.5 millimeters, and wherein the surface of the substrate handling chamber body has no more than 100 pores per 600 square centimeter area having widths that are greater than about 0.2 millimeters.

11. The semiconductor processing system of claim 1, wherein the iron (Fe) constituent forms between a non-trace amount and about 0.4% of the castable aluminum alloy by weight percentage, and wherein the manganese (Mn) constituent forms between about 0.4% and about 1.0% of the castable aluminum alloy by weight percentage.

12. The semiconductor processing system of claim 11, wherein the castable aluminum alloy further comprises:
an aluminum (Al) constituent forming between about 92.4% and about 95.6% of the castable aluminum alloy by weight percentage;
a chromium (Cr) constituent forming between about 0.05% and about 0.25% of the castable aluminum alloy by weight percentage;
a copper (Cu) constituent forming less than about 0.1% of the castable aluminum alloy by weight percentage; and
a magnesium (Mg) constituent forming between about 4% and about 4.9% of the castable aluminum alloy by weight percentage.

13. The semiconductor processing system of claim 12, wherein the castable aluminum alloy further comprises one or more of (a) a silicon (Si) constituent forming no more than about 0.4% of the castable aluminum alloy by weight percentage, (b) a titanium (Ti) constituent forming no more than about 0.15% of the castable aluminum alloy by weight percentage, (c) a zinc (Zn) constituent forming no more than about 0.25% of the castable aluminum alloy by weight percentage, (d) one or more rare earth constituent forming no more than 5% of the castable aluminum alloy by weight percentage.

14. The semiconductor processing system of claim 1, wherein the manganese (Mn) constituent-to-iron (Fe) constituent ratio is between about 1.125 and about 1.225.

15. The semiconductor processing system of claim 1, further comprising a load lock module connected to the substrate handling chamber body.

16. The semiconductor processing system of claim 15, further comprising an equipment front-end module connected to the load lock and coupled therethrough to the process module.

17. The semiconductor processing system of claim 1, wherein the manganese (Mn) constituent-to-iron (Fe) constituent ratio is between about 1.225 and about 1.325.

18. The semiconductor processing system of claim 1, wherein the manganese (Mn) constituent-to-iron (Fe) constituent ratio is between about 1.325 and about 1.425.

19. The semiconductor processing system of claim 1, wherein the manganese (Mn) constituent-to-iron (Fe) constituent ratio is between about 1.425 and about 1.525.

* * * * *